(12) United States Patent
Chen et al.

(10) Patent No.: US 8,592,962 B2
(45) Date of Patent: Nov. 26, 2013

(54) SEMICONDUCTOR DEVICE PACKAGES WITH PROTECTIVE LAYER AND RELATED METHODS

(75) Inventors: Kuang-Hsiung Chen, Taoyuan (TW); Sheng-Ming Wang, Taoyuan (TW); Hsiang-Ming Feng, Tainan (TW); Yu-Ying Lee, Taichung (TW); Mei-Lin Hsieh, Zhongli (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 79 days.

(21) Appl. No.: 13/219,981

(22) Filed: Aug. 29, 2011

(65) Prior Publication Data
US 2012/0104584 A1    May 3, 2012

(30) Foreign Application Priority Data
Oct. 29, 2010   (TW) ................. 99137284 A

(51) Int. Cl.
*H01L 23/495*   (2006.01)

(52) U.S. Cl.
USPC ........... 257/676; 257/665; 257/666; 257/670; 257/672; 257/E33.066; 257/E23.031; 257/E21.502; 438/111; 438/123; 438/124; 438/127

(58) Field of Classification Search
None
See application file for complete search history.

(56) References Cited

U.S. PATENT DOCUMENTS

| | | | |
|---|---|---|---|
| 5,592,025 A * | 1/1997 | Clark et al. ................. | 257/774 |
| 5,847,458 A | 12/1998 | Nakamura et al. | |
| 6,001,671 A | 12/1999 | Fjelstad | |
| 6,238,952 B1 | 5/2001 | Lin | |
| 6,242,284 B1 | 6/2001 | Kang et al. | |
| 6,261,864 B1 | 7/2001 | Jung et al. | |
| 6,291,271 B1 | 9/2001 | Lee et al. | |
| 6,306,685 B1 | 10/2001 | Liu et al. | |
| 6,333,252 B1 | 12/2001 | Jung et al. | |
| 6,342,730 B1 | 1/2002 | Jung et al. | |
| 6,348,726 B1 | 2/2002 | Bayan et al. | |
| 6,400,004 B1 | 6/2002 | Fan et al. | |
| 6,451,627 B1 | 9/2002 | Coffman | |
| 6,495,909 B2 | 12/2002 | Jung et al. | |

(Continued)

FOREIGN PATENT DOCUMENTS

| | | |
|---|---|---|
| CN | 101442035 | 5/2009 |
| CN | 101540309 | 9/2009 |

(Continued)

OTHER PUBLICATIONS

Lai et al.; "Development and performance charaterizations of a QFN/HMT package"; Electronic Components and Technology Conference; pp. 964-967 (2008).

*Primary Examiner* — Yasser Abdelaziez
(74) *Attorney, Agent, or Firm* — Klein, O'Neill & Singh, LLP

(57) ABSTRACT

A Quad Flat No Leads (QFN) package includes a lead frame, a chip, an encapsulant, and a protective layer. The lead frame includes a plurality of leads. Each of the leads has a lower surface that is divided into a contact area and a non-contact area. The chip is configured on and electrically connected to the lead frame. The encapsulant encapsulates the chip and the leads and fills spaces between the leads. The contact areas and the non-contact areas of the leads are exposed by the encapsulant. The protective layer covers the non-contact areas of the leads.

17 Claims, 10 Drawing Sheets

(56) References Cited

U.S. PATENT DOCUMENTS

| | | |
|---|---|---|
| 6,498,099 B1 | 12/2002 | McLellan et al. |
| 6,528,893 B2 | 3/2003 | Jung et al. |
| 6,534,330 B2 | 3/2003 | Sakamoto et al. |
| 6,545,347 B2 | 4/2003 | McClellan |
| 6,586,677 B2 | 7/2003 | Glenn |
| 6,658,734 B2 | 12/2003 | Yamada et al. |
| 6,664,615 B1 | 12/2003 | Bayan et al. |
| 6,700,188 B2 | 3/2004 | Lin |
| 6,812,552 B2 | 11/2004 | Islam et al. |
| 6,861,295 B2 | 3/2005 | Jung et al. |
| 6,927,096 B2 | 8/2005 | Shimanuki |
| 6,993,594 B2 | 1/2006 | Schneider |
| 6,995,459 B2 | 2/2006 | Lee et al. |
| 7,049,177 B1 | 5/2006 | Fan et al. |
| 7,125,798 B2 | 10/2006 | Sakamoto et al. |
| 7,183,630 B1 | 2/2007 | Fogelson et al. |
| 7,247,526 B1 | 7/2007 | Fan et al. |
| 7,271,032 B1 | 9/2007 | McLellan et al. |
| 7,608,930 B2 | 10/2009 | Kasuya et al. |
| 7,683,461 B2 | 3/2010 | Lau |
| 7,807,498 B2 | 10/2010 | Shoji et al. |
| 8,125,062 B2 | 2/2012 | Shoji et al. |
| 8,377,750 B2 | 2/2013 | Camacho et al. |
| 2003/0006055 A1 | 1/2003 | Chien-Hung et al. |
| 2003/0234454 A1* | 12/2003 | Pedron et al. ............ 257/787 |
| 2005/0046032 A1* | 3/2005 | Naruse et al. ............ 257/772 |
| 2005/0247944 A1 | 11/2005 | Haque et al. |
| 2007/0018291 A1 | 1/2007 | Huang et al. |
| 2007/0052076 A1 | 3/2007 | Ramos et al. |
| 2007/0059863 A1 | 3/2007 | Li et al. |
| 2007/0085199 A1 | 4/2007 | Ong et al. |
| 2007/0181983 A1 | 8/2007 | Takai et al. |
| 2008/0067649 A1 | 3/2008 | Matsunaga et al. |
| 2008/0258278 A1 | 10/2008 | Ramos et al. |
| 2010/0044843 A1 | 2/2010 | Chang Chien et al. |

FOREIGN PATENT DOCUMENTS

| | | |
|---|---|---|
| CN | 102044510 | 5/2011 |
| JP | 5166985 | 7/1993 |
| JP | 11195733 | 7/1999 |
| JP | 2001024135 | 1/2001 |

* cited by examiner

SEMICONDUCTOR DEVICE PACKAGES WITH PROTECTIVE LAYER AND RELATED METHODS

CROSS-REFERENCE TO RELATED APPLICATION

This application claims priority to Taiwan application Serial No. 99137284, filed on Oct. 29, 2010. The entirety of the priority application is hereby incorporated by reference.

TECHNICAL FIELD

The invention relates to semiconductor device packages, and more particularly to semiconductor device packages having a lead frame and related manufacturing methods.

BACKGROUND

A Quad Flat No leads (QFN) package is a type of semiconductor device package having short signal traces and, thus, fast signal transmission speed. Therefore, QFN packages are well suited to chip packages with high frequency transmission (e.g. high frequency transmission through the RF bandwidth), and have become common for package applications in the wireless field, for example.

In one method of manufacturing a conventional QFN package, a lead frame having die pads and leads is provided. Each of the leads has a full thickness portion in the periphery of the package and a half etch portion extending from the full thickness portion toward the die pad. Chips, or dies, are configured on the die pads and electrically connected to the half etch portions of the leads via bonding wires. The half etch portion of the leads, the bonding wires, and the chips are encapsulated and protected by a molding compound, or encapsulant, and the bottom surfaces of the full thickness portions of the leads are exposed from the encapsulant for electrical connection to an external device. A punching process or a sawing process is then performed to divide the structure into individual QFN packages.

When the size of a QFN package is enlarged, the distance between the chip and the full thickness portions of the leads increases. Therefore the lengths of the half etch portions of the leads is also increase to save the lengths of the bonding wires. However, since the bottoms of the half etch portions of the leads are removed, the half etch portions of the leads may bounce during the wirebonding process due to lack of stiffness. Bouncing may cause one or more of the conductive wires to be bonded in the wrong position with respect to the leads, and the yield of the wirebonding process may decrease accordingly.

SUMMARY

One of the present embodiments comprises a semiconductor device package. The semiconductor device package comprises a die pad and a plurality of leads surrounding the die pad. Each of the leads has a lower surface that is divided into a contact area and a non-contact area. The semiconductor device package further comprises a chip disposed on the die pad and electrically connected to the leads. The semiconductor device package further comprises a package body encapsulating the chip and portions of the leads, but leaving exposed at least a portion of the lower surface of each lead, the exposed portion comprising the contact area. The semiconductor device package further comprises a protective layer covering the non-contact area of each lead, but leaving exposed the contact area of each lead.

Another of the present embodiments comprises a semiconductor device package. The semiconductor device package comprises a die pad and a plurality of leads surrounding the die pad. At least one of the leads has a contact area and a non-contact area. The semiconductor device package further comprises a chip disposed on the die pad and electrically connected to the leads. The semiconductor device package further comprises a package body encapsulating the chip and partially encapsulating the leads. At least one of the leads has a recess within the non-contact area, and the package body occupies the recess.

Another of the present embodiments comprises a method of manufacturing a semiconductor device package. The method comprises providing a lead frame. The lead frame comprises a die pad and a plurality of leads. Each of the leads has a lower surface defining a contact area and a non-contact area. The method further comprises disposing a chip on the die pad and electrically connecting the chip to the lead frame. The method further comprises forming a package body encapsulating the chip, partially encapsulating the leads, and filling spaces between the leads. The package body exposes the contact areas and the non-contact areas of the leads. The method further comprises forming a protective layer on the non-contact areas to cover the non-contact areas while leaving the contact areas exposed.

BRIEF DESCRIPTION OF THE DRAWINGS

Common reference numerals are used throughout the drawings and the detailed description to indicate the same elements. The invention will be more apparent from the following detailed description taken in conjunction with the accompanying drawings.

DETAILED DESCRIPTION

Figure 1A:
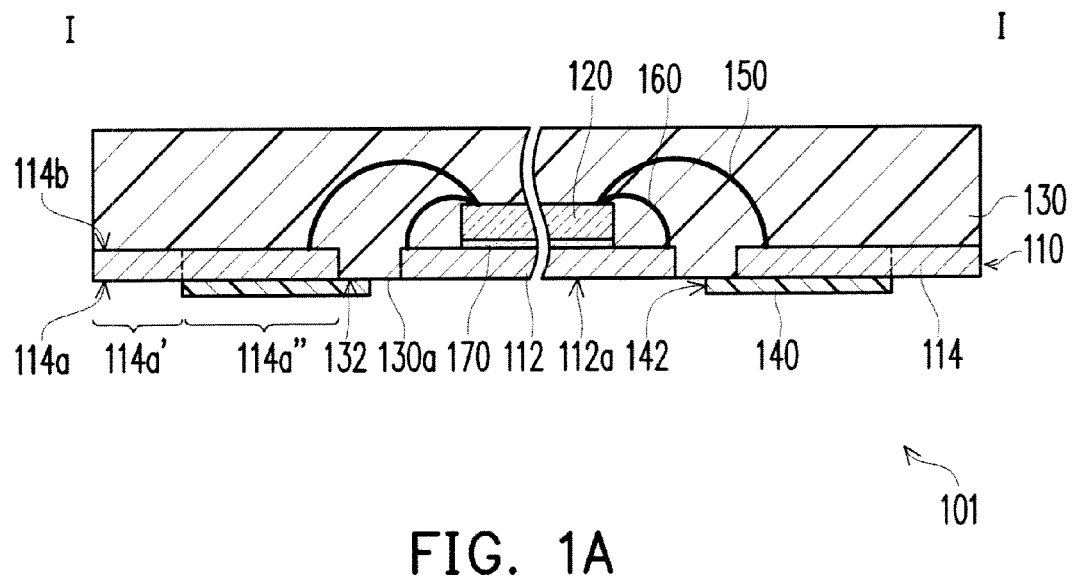
FIG. 1A is a cross-sectional side view illustrating one embodiment of the present semiconductor device packages, taken through the line I-I in FIG. 1B.
Figure 1B:
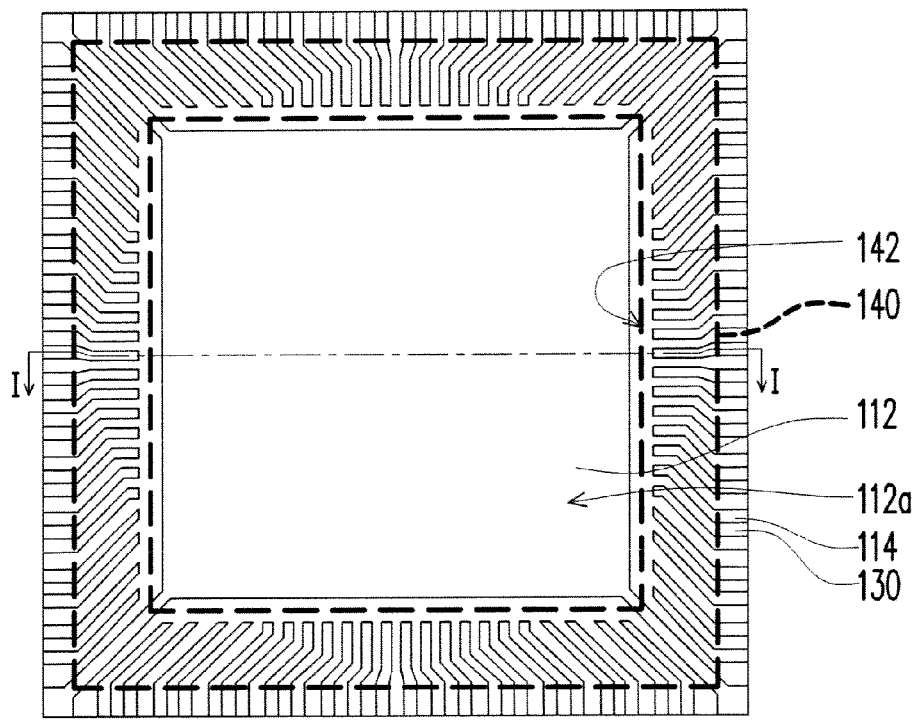
FIG. 1B is a bottom plan view of the semiconductor device package of FIG. 1A.

Referring to FIGS. 1A and 1B, a cross-sectional side view and a bottom plan view, respectively, of a semiconductor device package in the QFN family according to one of the present embodiments are illustrated. The cross-section of the semiconductor device package 101 shown in FIG. 1A is taken along the line I-I in FIG. 1B.

With reference to FIG. 1A, the semiconductor device package 101 of this embodiment includes a lead frame 110, a chip 120, a package body or encapsulant 130, a protective layer 140, a plurality of first bonding wires 150, and a plurality of second bonding wires 160. The lead frame 110 includes a die pad 112 and a plurality of leads 114 surrounding the die pad 112. The die pad 112 receives the chip 120, and the leads 114 serve as contacts for electrically connecting the chip 120 to external circuits, such as other semiconductor device packages or printed circuit/wiring boards (not shown). Each of the leads 114 has a lower surface 114a that is divided into a contact area 114a' and a non-contact area 114a" spaced inwardly from the contact area 114a'. The contact area 114a' has a size sufficient to allow mounting and soldering the lead 114 to the external device. In the case of a socket (not shown), has a size sufficient to allow mounting the package 101 in the socket to form a suitable electrical contact with the socket. The non-contact area 114a" is not connected to the external device.

The chip 120 is attached to the die pad 112 of the lead frame 110 and electrically connected to the leads 114 and the die pad 112. The chip 120 may be attached to the die pad 112 by an adhesive layer 170, or by any other suitable means. A set of first bonding wires 150 electrically connect the chip 120 to a top surface 114b of the non-contact area 114a" of each lead 114. A set of second bonding wires 160 electrically connect the chip 120 to the die pad 112.

With continued reference to FIG. 1A, the encapsulant 130 comprises a molding compound that encapsulates the chip 120 and the first bonding wires 150, and partially encapsulates the leads 114. The contact areas 114a' and the non-contact areas 114a" of each of the leads 114 are exposed from the encapsulant 130. In a central portion 130a, a bottom surface 132 of the encapsulant 130 and the lower surfaces 114a of the leads 114 are substantially coplanar. However, in other embodiments, the lower surfaces 114a of the leads 114 may protrude from the bottom surface 132 of the encapsulant 130.

The protective layer 140 is made of an insulating material, i.e. non-conductive, and covers the non-contact area 114a" of each of the leads 114, but does not cover the contact area 114a' of each lead 114. For example, the protective layer 140 may comprise epoxy resin, such as W258BR Wieder Black Ink, available from Tai-Ee Manufacturing Co. Ltd. In the present embodiments, the area of the non-contact area 114a" of each lead 114 may, for example, comprise approximately 25%-75% of the lower surface 114a of each lead 114. A thickness of the protective layer 140 may be between 5 µm and 50 µm.

The protective layer 140 has an opening 142 that exposes the bottom surface 112a of the die pad 112. The contact areas 114a' and the bottom surface 112a thus may be electrically connected to external circuits, such as other semiconductor device packages or printed circuit/wiring boards (not shown). Furthermore, since the opening 142 of the protective layer 140 exposes the bottom surface 112a of the die pad 112, heat generated during operation of the chip 120 can be dissipated to the ambient directly through the bottom surface 112a. The semiconductor device package 102 of this embodiment has favorable heat dissipation effects that facilitate normal operation of the chip 120.

Compared with conventional QFN packages, the leads 114 of the present embodiments advantageously have sufficient stiffness to resist lead bouncing during the wirebonding process. This advantage flows from the fact that the bottoms of the non-contact areas 114a" of the leads 114 are not removed, rendering that portion of each lead 114 thicker. In conventional QFN packages, the leads may bounce, move or tilt if the bond wires are attached on or near the half etch portion of the lead. Such bouncing or inadvertent lead movement can result in less than optimal wire bond integrity and/or misalignment of the lead. The bonding wires 150 of the present embodiments can be accurately bonded on the correct positions of the surface 114b without misalignment. Therefore, the yield of the wirebonding process is improved. Even though the non-contact areas 114a" of the leads are exposed from the encapsulant 130, they are covered and protected by the protective layer 140 to resist corrosion and oxidation of the leads.

Figure 2:
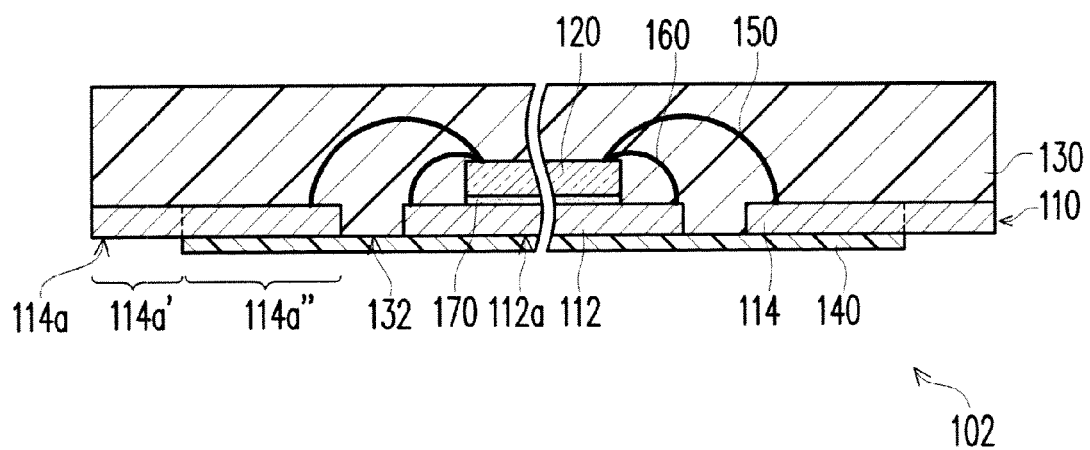
FIG. 2 is a cross-sectional side view illustrating another embodiment of the present semiconductor device packages.

The illustrated shape of the protective layer 140 is not limiting. The protective layer 140 in this embodiment is a block pattern, i.e., the protective layer 140 covers only portions of the encapsulant 130 between the leads 114, and the non-contact areas 114a" of the leads 114. However, other configurations of the protective layer 140 may be suitable. For example, with reference to FIG. 2, a cross-sectional side view of a semiconductor device package according to another embodiment is illustrated. In this embodiment, the protective layer 140 of the semiconductor device package 102 covers the entire bottom surface 112a of the die pad 112 in addition to portions of the encapsulant 130 between the leads 114, and the non-contact areas 114a" of the leads 114.

Figure 3A:
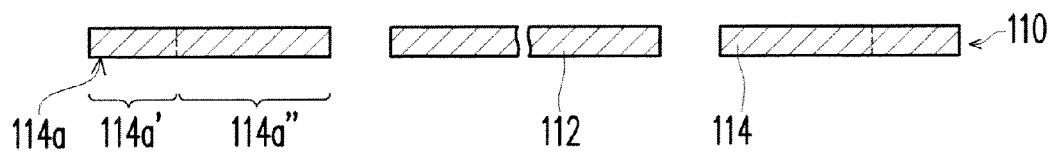
FIGS. 3A-3G are cross-sectional side views of steps in a method of manufacturing a semiconductor device package.

FIGS. 3A-3G are cross-sectional side views showing a method of manufacturing a semiconductor device package according to one of the present embodiments. With reference to FIG. 3A, the lead frame 110 is provided. The lead frame 110 includes the die pad 112 and the plurality of leads 114 surrounding or circumscribing the perimeter of the die pad 112.

Figure 3B:
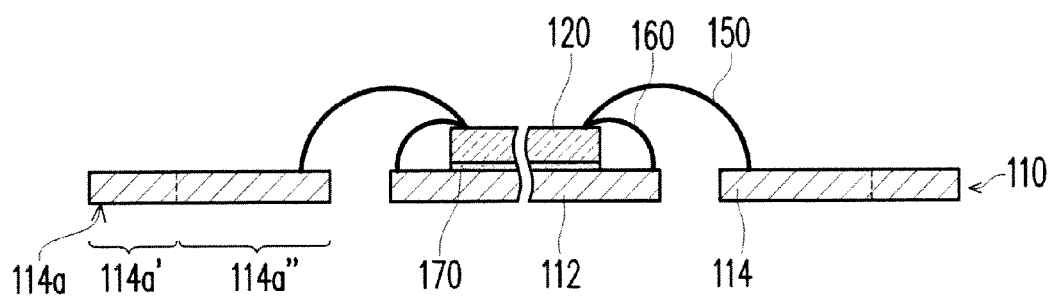

With reference to FIG. 3B, the chip 120 is attached to the die pad 112 of the lead frame 110 and electrically connected to the die pad 112 and the leads 114 of the lead frame 110. To enhance adhesion between the chip 120 and the die pad 112, the adhesive layer 170 may be formed on the die pad 112 before the chip 120 is attached to the die pad 112. The chip 120 is then fixed to the die pad 112 through the adhesive layer 170. In a wire bonding process, the first bonding wires 150 are connected between the chip 120 and the leads 114, and the second bonding wires 160 are connected between the chip 120 and the die pad 112. The chip 120 is thus electrically connected to the leads 114 and the die pad 112 of the lead frame 110 through the first bonding wires 150 and the second bonding wires 160.

Figure 3C:
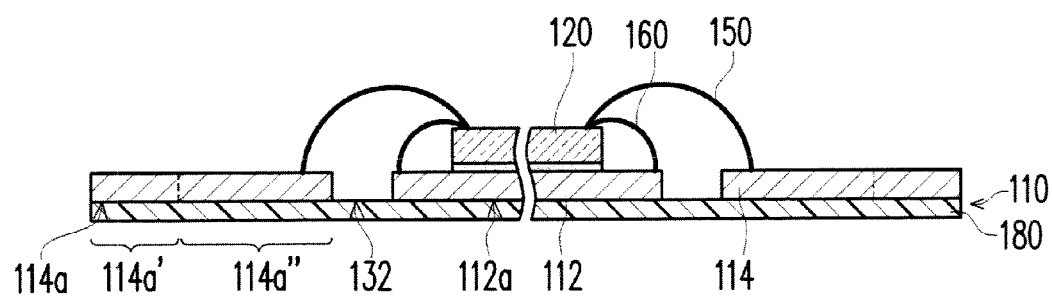

With reference to FIG. 3C, an adhesive tape 180 is adhered to the bottom surface 112a of the die pad 112 and the lower surfaces 114a of the leads 114. The adhesive tape 180 covers the contact area 114a' and the non-contact area 114a" of each of the leads 114.

Figure 3D:
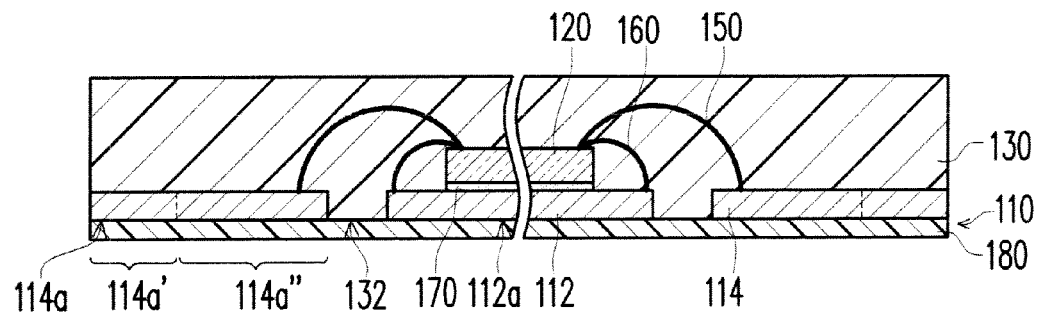

With reference to FIG. 3D, a molding process forms the encapsulant 130 to cover the chip 120, the leads 114, and the first and second bonding wires 150, 160. Additionally, the encapsulant 130 fills spaces between adjacent leads 114, and between the die pad 112 and the leads 114. The adhesive tape 180 prevents the encapsulant 130 from reaching the bottom surfaces 114a of the leads 114 and the bottom surface 112a of the die pad 112. The adhesive tape 180 allows the bottom surface 132 of the encapsulant 130 to be substantially flush or coplanar with the lower surfaces 114a of the leads 114.

Figure 3E:
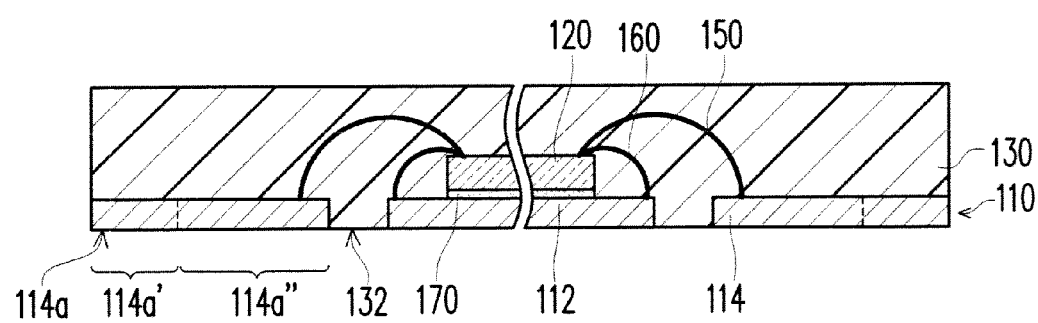

With reference to FIG. 3E, the adhesive tape 180 is removed to expose the bottom surface 112a of the die pad 112 and the lower surfaces 114a of the leads 114, including the contact area 114a" and the non-contact area 114a'". At this point, to increase the reliability of subsequent steps, a chemical surface cleansing process may be performed on the non-contact area 114a" of each of the leads 114. The chemical surface cleansing process cleanses and increases the roughness of the non-contact areas 114a". The chemical surface cleansing process may, for example, comprise cleaning with a mixture of sodium persulfate, sulfuric acid and copper sulfate. Similarly, an oxyhydrogen flame surface cleansing process may be preformed on the portions of the encapsulant 130 between adjacent leads 114. Such a process cleanses the bottom surfaces 132 of the encapsulant 130.

Figure 3F:
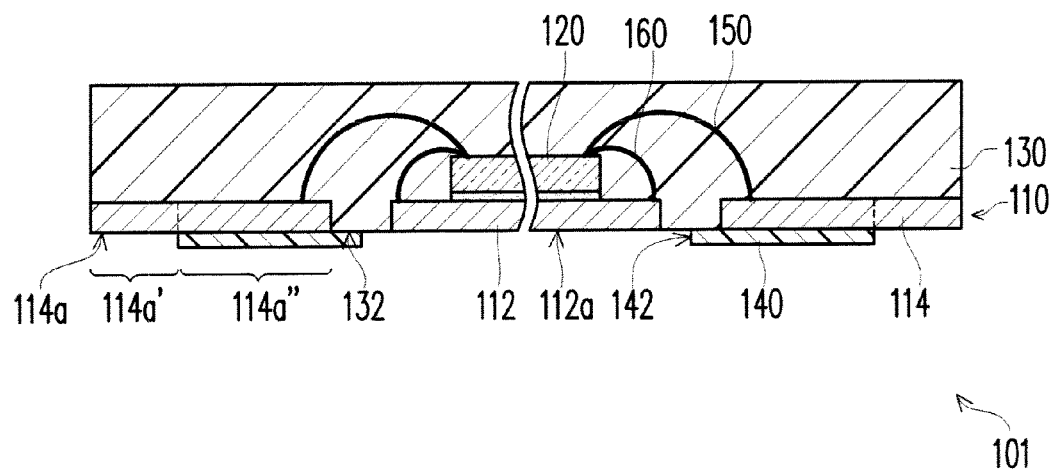
Figure 3G:
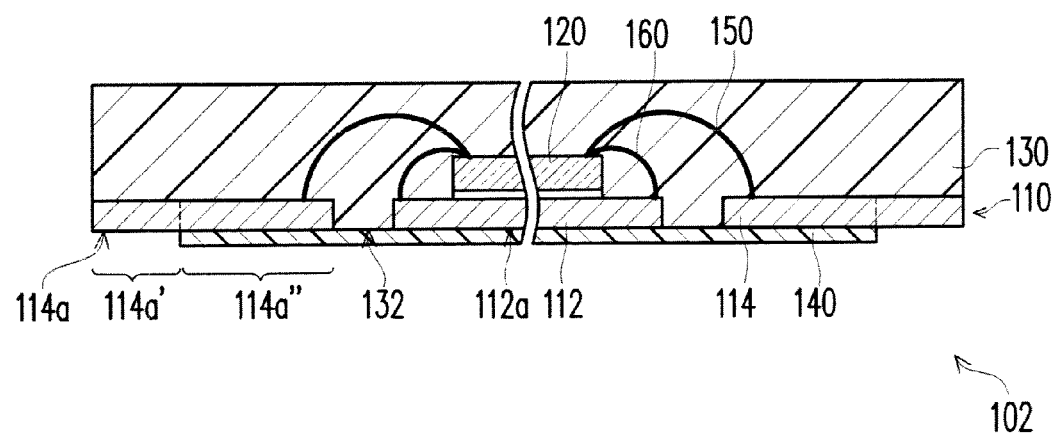

With reference to FIG. 3F, the protective layer 140 is formed to cover the non-contact areas 114a" of the leads 114. The protective layer 140 is an insulating material, such as, for example, epoxy resin. Forming the protective layer 140 may, for example, comprise ink-jet printing, screen printing, pad printing, another type of transfer printing, or any other process. The protective layer 140 does not cover the contact areas 114a' of the leads 114, and has an opening 142 that exposes the bottom surface 112a of the die pad 112. The contact areas 114a and the bottom surface 112a thus may serve to electrically connect the semiconductor device package 101 to external devices (not shown). Further, the bottom surface 112a may dissipate heat from the semiconductor device package 101. The protective layer 140 may also cover the lower surface 132 of the encapsulant 130 between the leads 114, as illustrated. In an alternative embodiment, as shown in FIG. 3G, the protective layer 140 may cover the entire bottom surface 112a of the die pad 112.

A curing process may be performed on the protective layer 140. In one embodiment, the curing process includes exposure to infrared light. After the curing process is performed, a post-mold curing (PMC) process may be performed on the encapsulant 130.

In the present embodiments, the contact areas 114a' of the leads 114 are left exposed by the protective layer 140. Therefore, compared with conventional QFN packages in which the bottoms of the non-contact areas of the leads are removed by performing a half-etching process, since the bottom of the non-contact area 114a" of the leads 114 of the present embodiments are not removed, they have greater stiffness. The greater stiffness resists or prevents bouncing of the leads during the wire bonding process. Therefore, the yield of the wire bonding process is improved. Even though the non-contact areas 114a" of the leads are not completely surrounded by the encapsulant 130, they are covered and protected by the protective layer 140 to resist corrosion and oxidation of the leads.

Figure 4A:
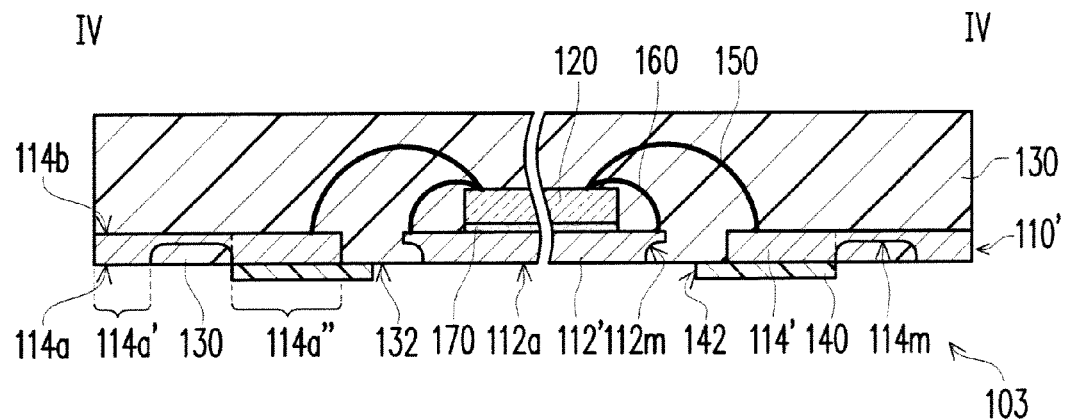
FIG. 4A is a cross-sectional side view illustrating another embodiment of the present semiconductor device packages, taken through the line IV-IV in FIG. 4B.
Figure 4B:
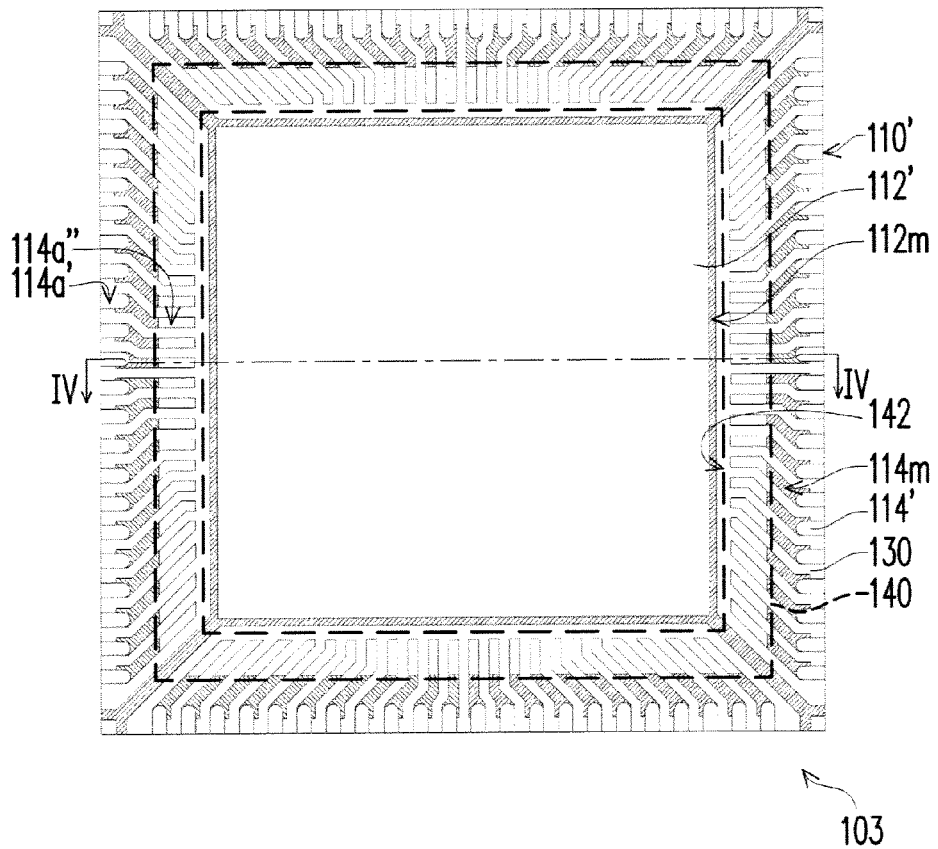
FIG. 4B is a bottom plan view of the semiconductor device package of FIG. 4A.

FIGS. 4A and 4B are a cross-sectional side view and a bottom plan view, respectively, of a semiconductor device package 103 according to another embodiment. The section view of FIG. 4A is taken along line IV-IV in FIG. 4B. With reference to FIG. 4A, the die pad 112' of the lead frame 110' has edge recesses 112m at its periphery. Similarly, each of the non-contact areas 114a" of the leads 114' has a recess 114m The edge recesses 112m and recesses 114m receive the encapsulant 130 to enhance the strength of the hold between the encapsulant 130 and the die pad 112' and between the encapsulant 130 and the lead frame 110'. The recesses 114m reduce the widths of the contact areas 114a' and the non-contact areas 114a", since the protective layer 140 does not extend over the recesses 114m, and since the encapsulant 130 in the recesses 114m is a dielectric.

The edge recesses 112m and the recesses 114m may be formed by half etching, for example. For example, the half etching process may be performed in connection with providing the lead frame 110 shown in FIG. 3A.

Figure 5A:
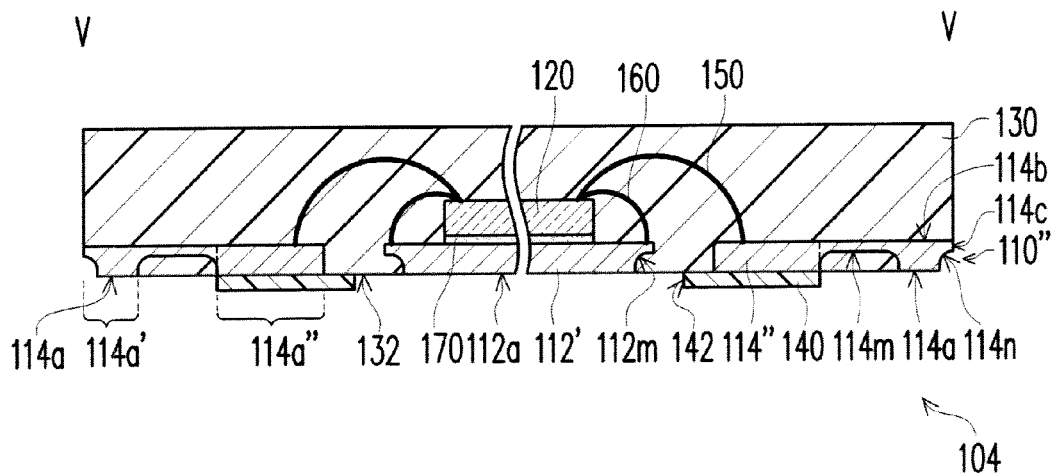
FIG. 5A is a cross-sectional side view illustrating another embodiment of the present semiconductor device packages, taken through the line V-V in FIG. 5B.
Figure 5B:
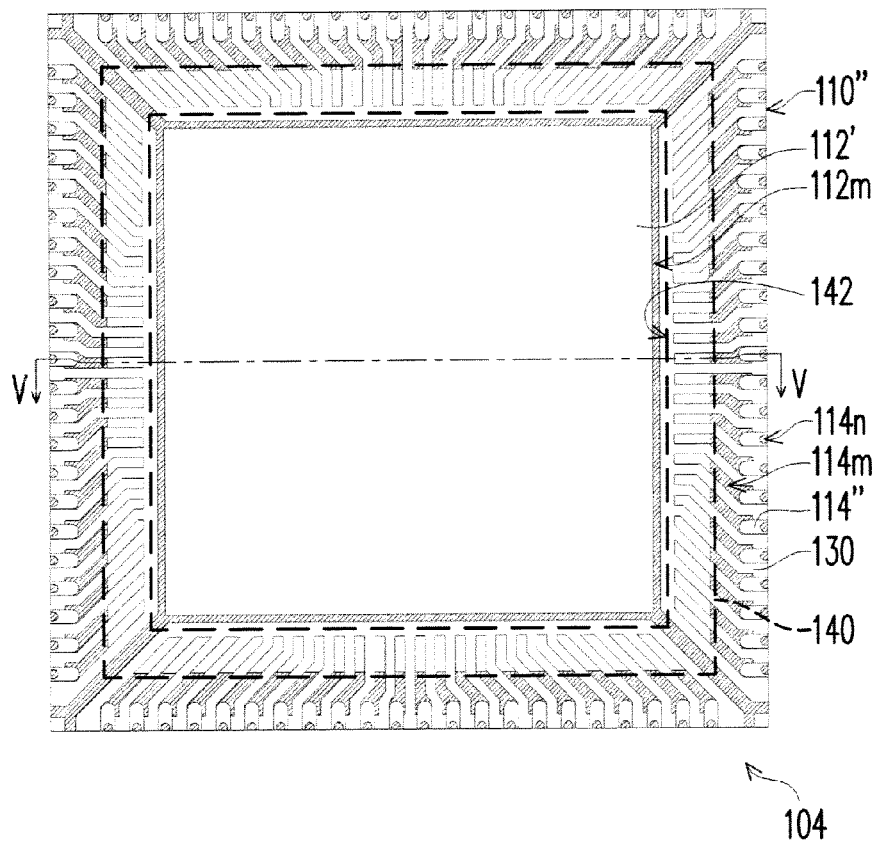
FIG. 5B is a bottom plan view of the semiconductor device package of FIG. 5A.

FIGS. 5A and 5B are a cross-sectional side view and a bottom plan view, respectively, of a semiconductor device package 104 according to another embodiment. The section of FIG. 5A is taken along line V-V in FIG. 5B. The semiconductor device package 104 of FIG. 5A is similar to the semiconductor device package 103 of FIG. 4A, except that the leads 114" further include solder recesses 114n, also referred to as fillets or reentrants, i.e. hollowed out portions where solder can reenter the lead during PCB surface mount and reflow thereby strengthening the solder joint because of the increased surface area and improving solder joint reliability between the semiconductor package and the PCB. When the contact areas 114a' of the leads 114" are soldered to a printed circuit board, the solder recesses 114n increase the solder contact area and solder capacity so as to enhance the connection strength. The solder recesses 114n are described in greater detail below with reference to FIG. 5C.

Figure 5C:
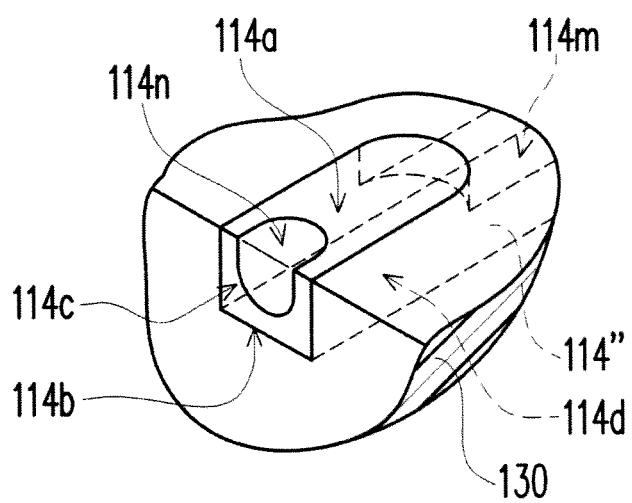
FIG. 5C is a partial perspective view of a portion of the semiconductor device package of FIG. 5A.

FIG. 5C is a partial perspective view of the underside of the semiconductor device package 104, with a focus on one of the solder recesses 114n. The solder recess 114n is disposed at the outer lower edge of the lead 114", and may be characterized as a cupped or hollowed out portions of the lower surface 114a and an end surface 114c of the lead 114". The solder recess 114n does not extend to the upper surface 114b or side surfaces 114d of the lead 114". The encapsulant 130 does not cover the solder recess 114n. Rather, the solder recess 114n provides additional surface area and/or volume for solder to wick or adhere to the lead 114" during PCB surface mount.

Figure 6A:
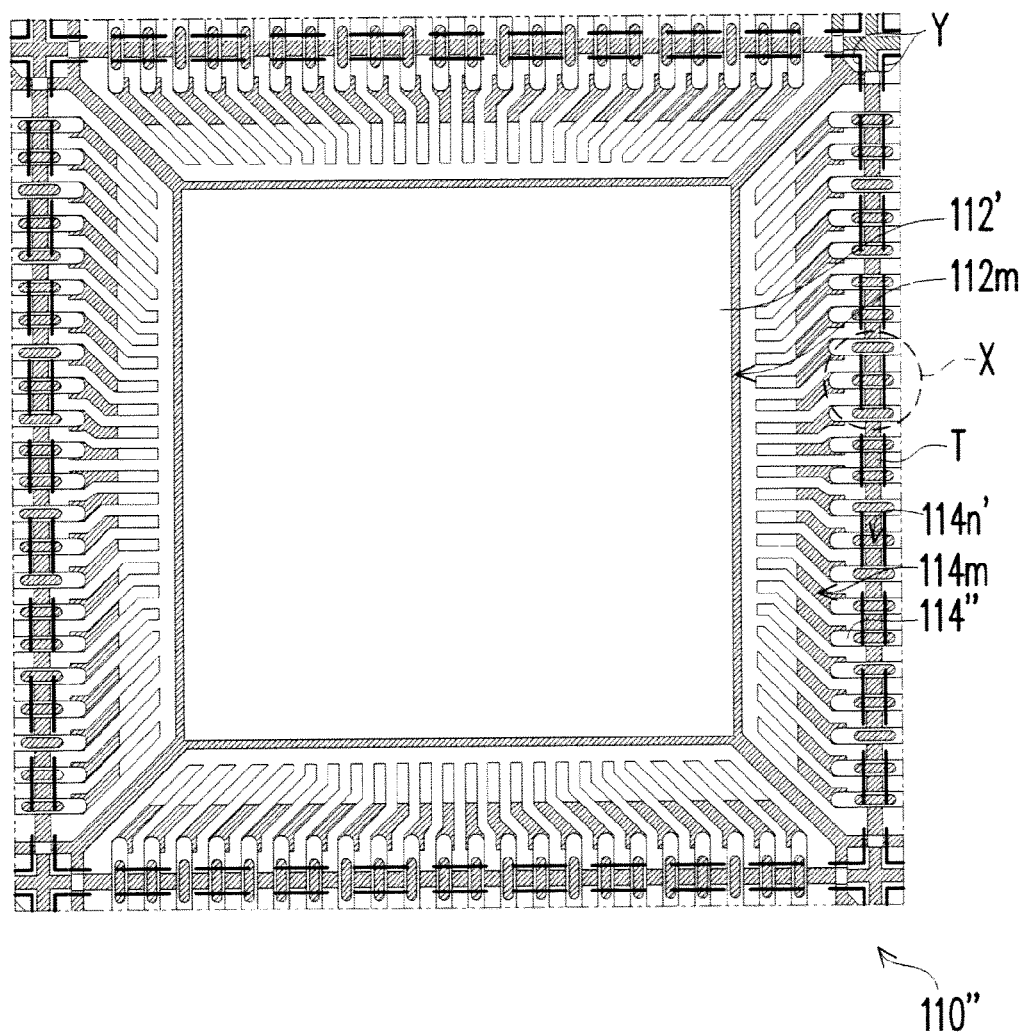
FIG. 6A is a bottom plan view illustrating a lead frame array including a plurality of the semiconductor device package of FIG. 5C prior to being singularized.
Figure 6B:
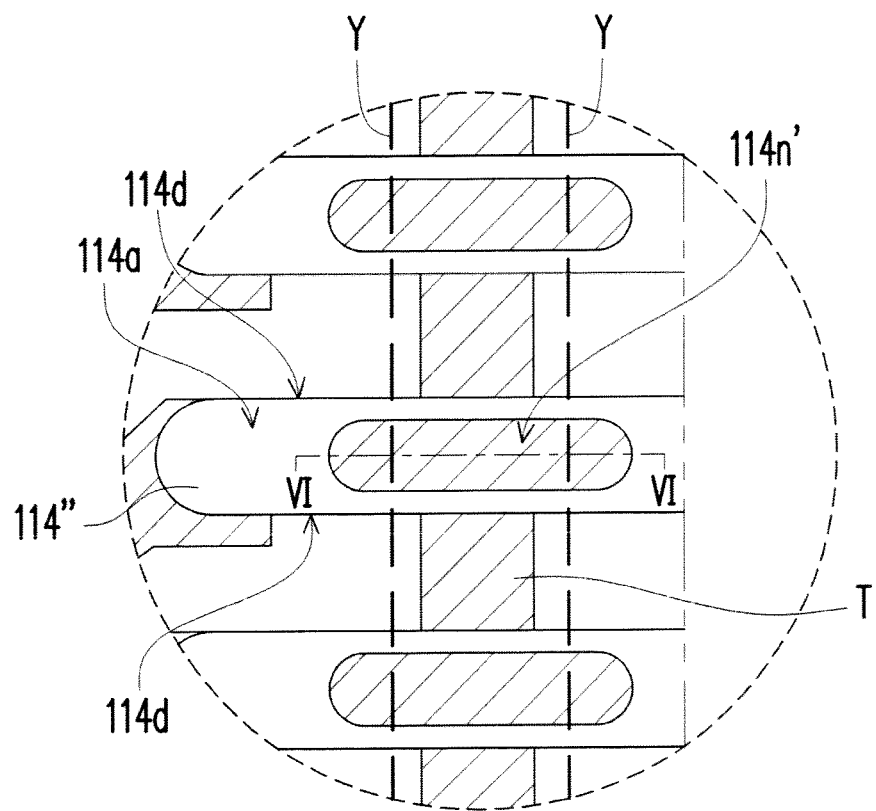
FIG. 6B is a detail view of the portion of FIG. 6A indicated by the circle X.

FIG. 6A illustrates a bottom plan view of one of the lead frames 104 of FIGS. 5A-5C in a lead frame matrix prior to singulation. The other lead frames 104 in the matrix are omitted for clarity. FIG. 6B is an enlarged view of the portion X depicted in FIG. 6A. With reference to FIG. 6B, a plurality of slots 114n' is formed on two adjacent leads 114". The slots 114n' may, for example, be formed by half etching. A plurality of tied portions T connects adjacent leads 114" to each other prior to singulation. The tied portions T may be half etched to reduce their thickness. The slots 114n' are disposed within the lower surface 114a, and spaced apart from both of the side surfaces 114d of the leads 114" so that the encapsulant 130 does not cover the slots 114n' during the molding process. A cutting line Y extends over the tied portions T and end portions of the slots 114n'.

Figure 6C:
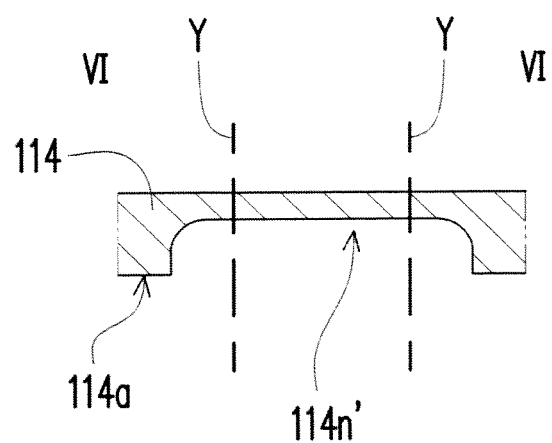
FIG. 6C is a cross-sectional side view taken along line VI-VI in FIG. 6B.

FIG. 6C is a cross-sectional side view taken along line VI-VI in FIG. 6B. When a cutting process is performed along the cutting line Y, the tied portion T and the central portion of the slot 114n' are removed, leaving the two ends of the slots 114n' on the lead 114". The ends of the slots 114n' form the solder recesses 114n in FIG. 5C. For example, the half etching and cutting processes may be performed in connection with providing the lead frame 110 shown in FIG. 3A, so as to form the solder recesses 114n.

In light of the foregoing, since the bottoms of the non-contact areas of the leads are not removed, they have greater stiffness that resists bouncing of the leads during the wire bonding process. Therefore, compared with conventional QFN packages in which the bottoms of the wire bonding portions of the leads are removed by performing the half-etching process, the semiconductor device package of the present embodiments improve the yield of the wire bonding process.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the disclosure and the actual apparatus due to manufacturing processes and tolerances. There may be other embodiments of the invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor device package comprising:
a die pad;
a plurality of leads surrounding the die pad, each of the leads having a lower surface, the lower surface being divided into a contact area and a non-contact area;
a chip disposed on the die pad and electrically connected to the leads;
a package body encapsulating the chip and portions of the leads, but leaving exposed at least a portion of the lower surface of each lead, the exposed portion comprising the contact area; and
a non-conductive layer covering the non-contact area of each lead, but leaving exposed the contact area of each lead; wherein the non-conductive layer has an opening exposing a bottom surface of the die pad.

2. The semiconductor device package of claim 1, further comprising at least one first bonding wire, the at least one first bonding wire being electrically connected to the chip and one of the leads.

3. The semiconductor device package of claim 2, further comprising at least one second bonding wire, the at least one second bonding wire being electrically connected to the chip and the die pad.

4. The semiconductor device package of claim 1, wherein the non-conductive layer further covers a portion of the encapsulant located between the leads.

5. The semiconductor device package of claim 1, wherein the die pad has an edge recess at its periphery, and the package body occupies the edge recess.

6. The semiconductor device package of claim 1, wherein at least one of the leads has a recess within the non-contact area, and the package body occupies the recess.

7. The semiconductor device package of claim 1, wherein at least one of the leads has a solder recess within its lower surface and within an end surface, but the solder recess does not extend to an upper surface of the lead.

8. The semiconductor device package of claim 1, wherein an area ratio of the contact area to the non-contact area is in a range from 25% to 75%.

9. A semiconductor device package comprising:
a die pad;
a plurality of leads surrounding the die pad, wherein at least one of the leads has a contact area and a non-contact area;
a non-conductive layer covering the non-contact area of the lead, but leaving exposed the contact area of the lead; wherein the non-conductive layer has an opening exposing a bottom surface of the die pad;
a chip disposed on the die pad and electrically connected to the leads; and
a package body encapsulating the chip and partially encapsulating the leads;
wherein at least one of the leads has a middle recess within the non-contact area, and the package body occupies the middle recess.

10. The semiconductor device package of claim 9, wherein the non-conductive layer further covers a portion of the encapsulant located between the leads.

11. The semiconductor device package of claim 9, wherein the die pad has an edge recess at its periphery, and the package body occupies the edge recess.

12. The semiconductor device package of claim 9, wherein at least one of the leads has a solder recess within its lower surface and within an end surface, but the solder recess does not extend to an upper surface of the lead.

13. The semiconductor device package of claim 9, wherein an area ratio of the contact area to the non-contact area is in a range from 25% to 75%.

14. A method of manufacturing a semiconductor device package, the method comprising:
providing a lead frame, the lead frame comprising a die pad and a plurality of leads, each of the leads having a lower surface defining a contact area and a non-contact area;
disposing a chip on the die pad and electrically connecting the chip to the lead frame;
forming a package body encapsulating the chip, partially encapsulating the leads, and filling spaces between the leads, the package body exposing the contact areas and the non-contact areas of the leads; and
forming a protective layer on the non-contact areas to cover the non-contact areas while leaving the contact areas exposed.

15. The manufacturing method of claim 14, further comprising performing a chemical surface cleansing process on the contact areas of the leads before forming the protective layer.

16. The manufacturing method of claim 14, further comprising performing an oxyhydrogen flame surface cleansing process on a portion of the encapsulant filling spaces between the leads before forming the protective layer.

17. The manufacturing method of claim 14, further comprising performing a curing process on the protective layer after forming the protective layer.

* * * * *